United States Patent [19]
Burm et al.

[11] Patent Number: 6,139,995
[45] Date of Patent: Oct. 31, 2000

[54] METHOD OF MANUFACTURING SCHOTTKY GATE TRANSISTOR UTILIZING ALIGNMENT TECHNIQUES WITH MULTIPLE PHOTORESIST LAYERS

[75] Inventors: Jinwook Burm, Seoul, Rep. of Korea; Robert Alan Hamm, Staten Island, N.Y.; Rose Fasano Kopf, Greenbrook, N.J.; Robert William Ryan, Piscataway, N.J.; Alaric Tate, Chatham, N.J.

[73] Assignee: Lucent Technologies Inc., Murray Hill, N.J.

[21] Appl. No.: 09/523,210

[22] Filed: Mar. 10, 2000

Related U.S. Application Data

[62] Division of application No. 09/111,534, Jul. 8, 1998, Pat. No. 6,042,975.

[51] Int. Cl.$^7$ ........................................................ G03F 9/00
[52] U.S. Cl. ........................... 430/22; 430/312; 430/315; 430/328; 438/167; 438/172; 438/574
[58] Field of Search ............................... 430/22, 312, 315, 430/328; 438/167, 172, 574

[56] References Cited

U.S. PATENT DOCUMENTS

| | | | |
|---|---|---|---|
| 5,496,669 | 3/1996 | Pforr et al. ................................. | 430/22 |
| 6,042,975 | 3/2000 | Burm et al. ............................... | 430/22 |

*Primary Examiner*—Christopher G. Young
*Attorney, Agent, or Firm*—Thomas, Kayden, Horstemeyer & Risley LLP

[57] ABSTRACT

The specification describes a photolithography process using multiple exposures to form z-dimension patterns. Multiple exposures at different thickness levels are made using photomasks aligned with a latent image of alignment marks formed during the first exposure. The latent image is visible to the alignment system of commercial steppers.

12 Claims, 5 Drawing Sheets

METHOD OF MANUFACTURING SCHOTTKY GATE TRANSISTOR UTILIZING ALIGNMENT TECHNIQUES WITH MULTIPLE PHOTORESIST LAYERS

RELATED APPLICATION

This application is a divisional application of application Ser. No. 09/111,534, filed Jul. 8, 1998 now U.S. Pat. No. 6,042,975.

FIELD OF THE INVENTION

This invention relates to lithography techniques used in the manufacture of electronic and photonic integrated circuits.

BACKGROUND OF THE INVENTION

In state of the art semiconductor device processing, lithography is a key technology in fabricating wafers with large numbers of chip sites. Although x-ray and electron beam lithography tools are useful and effective, especially for mask making, photolithography remains the most widely used lithography tool for semiconductor wafer fabrication. Likewise, although a variety of exposure tools have been developed over the years, step and repeat cameras are essentially ubiquitous in commercial integrated circuit manufacture. These tools, usually referred to as steppers, rely for their effectiveness on the ability to register photomasks in exact alignment from level to level. Typical state of the art wafer fabrication processes have several levels or layers where photomasks are employed in conjunction with standard process steps to define features in the device substrate or on the layers. In the usual process, alignment marks are formed on the first level to provide means for registering the photomask for the subsequent photolithography steps. The marks usually consist of an etched pattern formed by photolithography.

Photolithographic patterns are typically made by spinning a uniform coating of photoresist over the entire wafer, exposing the photoresist with actinic light directed through a photomask, and developing the photoresist to leave a photoresist pattern.

In this description, the term photomask refers to the master mask or reticle that defines the pattern of actinic radiation incident on the photoresist. The term lithographic mask refers to the patterned photoresist which is used to define the regions where processing activity, e.g. etching, occurs in the layer masked by the photoresist. Each photomask, and the photoresist pattern produced therefrom, typically has imbedded therein a series of alignment marks, which are key ingredients in multilevel wafer fabrication. For example, if the first photoresist pattern is used to mask an oxide layer, silicon layer, or a metal layer for an etch step, the alignment marks will be transferred to the layer as an etched pattern. In this way when each sequential layer is deposited and patterned, the alignment marks from the first layer can be used to register all succeeding photomasks. Thus the desired topography can be constructed with great precision in the x-y planes. In projection lithography systems, the alignment itself is usually performed with automated tools. State of the art steppers have vision systems that easily identify the alignment marks on the wafer and automatically register the next photomask with the alignment marks previously formed.

Situations arise in semiconductor wafer fabrication where it would be advantageous for a single layer of photoresist to be exposed to more than one photomask. Among these situations are forming patterns in the third, i.e. z-, dimension, such as in forming T-gates or in forming severe undercuts. If these advantageous situations arise in the first lithographic step, it would be assumed that alignment of the second photomask to the first photomask must be accomplished without the precision alignment marks normally available in wafer fabrication. Such a process would yield significant alignment errors, and would in many instances of commercial practice be impractical.

SUMMARY OF THE INVENTION

We have developed a process for making z-dimension patterns using sequential photomask exposures in a single level of photoresist. The single level of photoresist may comprise one or more photoresist layers. The multiple photomask exposures are made sequentially, and the multiple patterns are developed simultaneously. A key feature in the multiple exposure is the use of latent alignment marks formed in the photoresist after the first photomask exposure but before the photoresist is developed. It has been found that these marks, while difficult to resolve by human vision, are visible and recognizable by the laser alignment tool of the stepper apparatus. Subsequent reticles in the multiple exposure are aligned to these marks.

DETAILED DESCRIPTION

Figure 1:
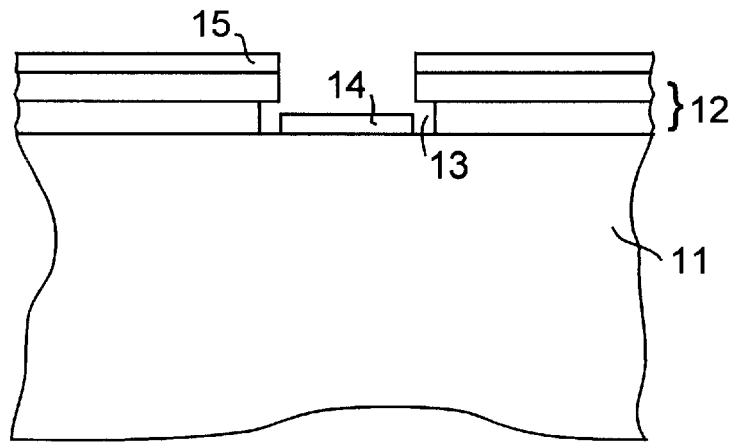
FIGS. 1 and 2 are schematic diagrams of a lift-off process for patterning a metal layer in the manufacture of semiconductor devices.
Figure 2:
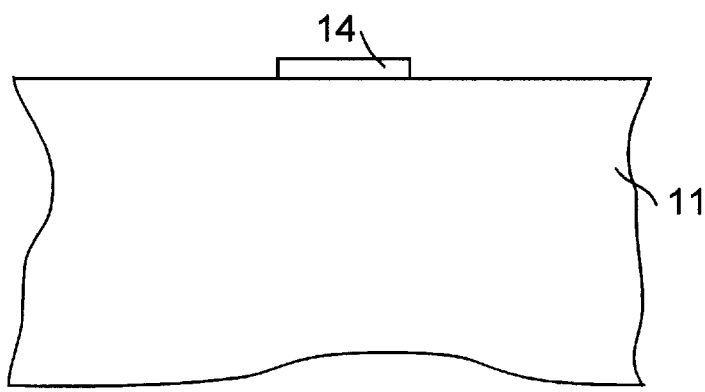

With reference to FIG. 1, a portion of a semiconductor substrate 11 is shown with lift-off mask 12. The lift-off mask is typically photoresist and can be formed by a single layer, or by multiple layers as shown. The objective is to develop a significant undercut 13 in the layer so that when the metal layer is deposited there is sufficient physical discontinuity to discourage metal stringers between the metal 14 in the window and the metal 15 on the lift-off mask 12. The structure after lift-off is shown in FIG. 2.

Figure 3:
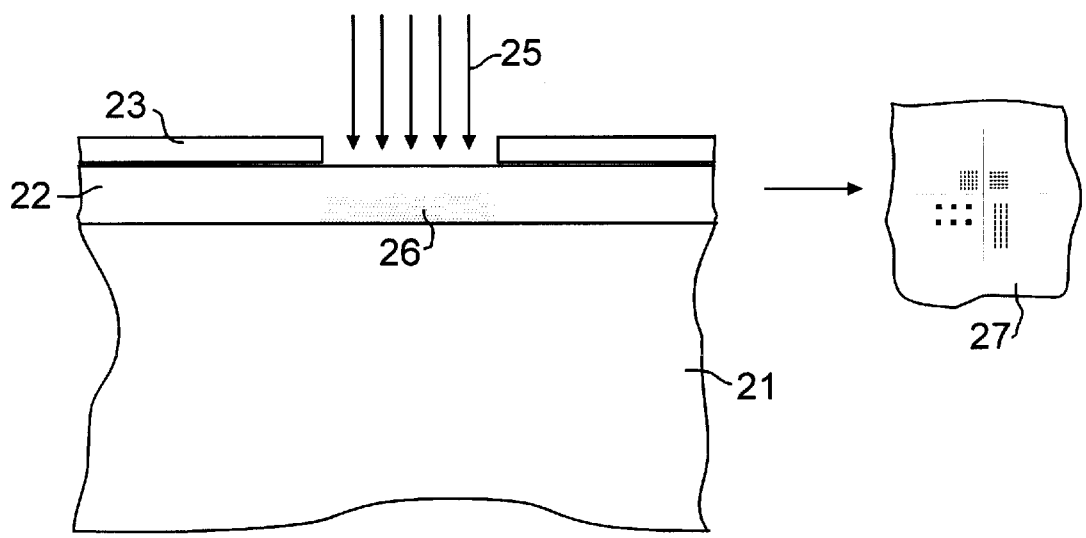
FIGS. 3–5 represent steps in a multiple exposure photolithographic process for making a lift-off mask according to the invention.

A process according to the invention for forming the lift-off mask with the desired undercut will be described in conjunction with FIGS. 3–5. The semiconductor substrate 21 is shown with a photoresist layer 22. The substrates used to demonstrate the invention consisted of 2" diameter, 25 mil thick wafers of (100) Si, GaAs, and InP. The photoresist was Shipley 1818 spun at 3000 RPM, and baked on a hot plate at 110° C. for 60 sec, resulting in a resist thickness of 2.1 $\mu$m. The resist coated wafers were exposed in a Nikon NSR 1505G6E stepper. Exposure wavelength was 436 nm. Exposure dose and depth of focus, or focus offset from the substrate-resist interface, were optimized using a focus/expose matrix of (0 μm to −1.0 μm)/(600 mjoules to 1400 mjoules) in steps of 0.25 μm and/or 100 mjoules. In the first of the multiple exposures, as shown in FIG. 3, approximately half the thickness of the resist layer 22 was exposed using the first photomask 23. UV radiation is represented in FIG. 3 by arrows 25, and the exposed region of the photoresist layer is shown at 26. The alignment marks in photomask 26 are represented schematically at 27, and are located typically at an appropriate edge or corner of each integrated circuit pattern.

Figure 4:
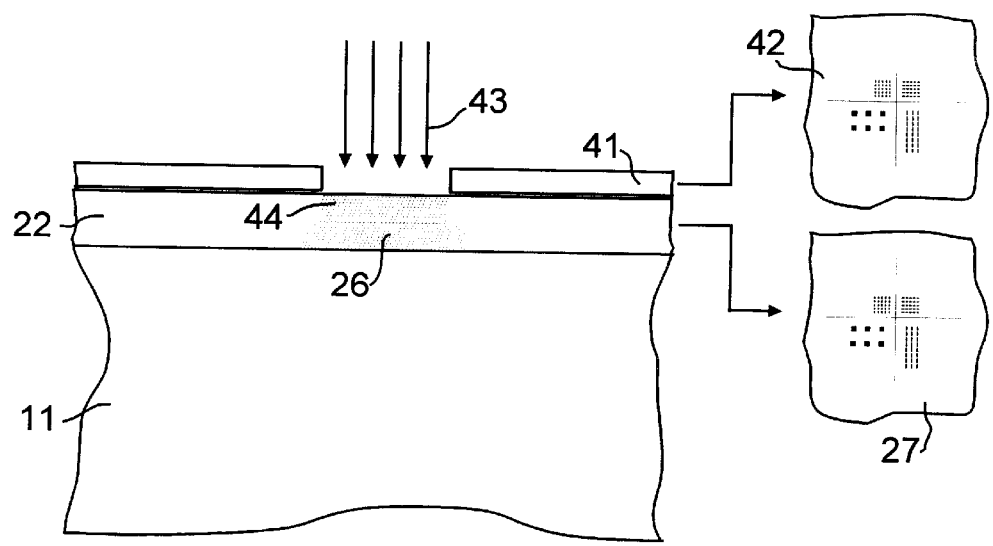

After the actinic UV exposure of FIG. 3, the alignment marks 27 are transferred to photoresist layer 22 as a latent image and remain there for the second photomask alignment and exposure, shown in FIG. 4. The second photomask 41, with a mask opening smaller than the opening of the first photomask (FIG. 3), is shown with actinic radiation indicated at 43. This step exposes portion 44 of resist layer 22. Using the He—Ne laser alignment system of the stepper, the second photomask is aligned by registering alignment marks on the photomask 42, to the latent alignment marks 27 already formed in photoresist layer 22.

Figure 5:
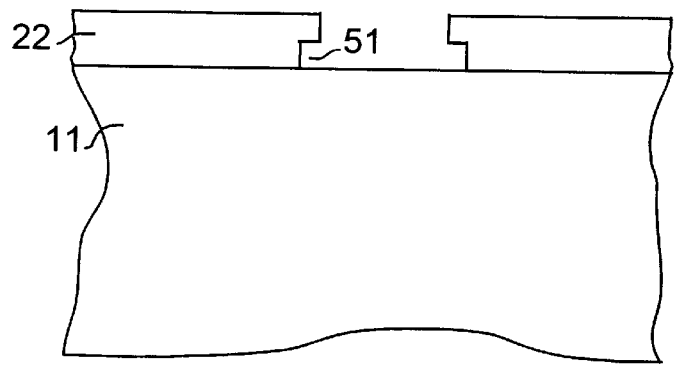

The exposed portions 26 and 44 of photoresist layer 22 are then developed and dissolved away by standard procedures, leaving the photoresist pattern shown in FIG. 5, with the pronounced undercut 51 in the opening as desired.

In the figures accompanying this description the photomask is shown schematically and appears positioned close to the surface of the photoresist layer as it would be in a contact printing process. However, as will be evident to those skilled in the art, in a stepper the photomask will normally be projected onto the photoresist surface by the step and repeat camera.

In the sequence of steps illustrated in FIGS. 3–5, only one photomask was aligned using a latent alignment image according to the invention. Multiple photomask alignments have also been demonstrated using this technique.

The invention can also be used with contact printing lithography. The alignment marks are visible to the stepper equipment, but are only marginally visible to human operators frequently used in contact printing. However, contact printing using human operator alignment can be performed with the aid of a contrast enhancement layer. For example, CEM BC 5, a known barrier coating, can be spun on the photoresist layer, followed by the application of a known contrast enhancement material, CEM 420 WS.

The ability to form z-dimension features gives rise to a variety of applications in semiconductor processing. For example, the photolithography process of the invention is well suited to the formation of T-gates. This application will be described in conjunction with FIGS. 6–15.

As the feature size in integrated circuits continues to shrink the gate size for transistors must be correspondingly reduced. In state of the art III–V transistor devices the gate size has reached the point where gate resistance due to the small gate dimensions is a performance limiting factor. To overcome this limitation T-shaped gates and Y-shaped gates have been proposed. See e.g. M. H. Somerville et al "A model for Tunneling-Limited Breakdown in High Power HEMTs", IEEE IEDM, pp. 35–38 (1996); F. Ren et aL, "Y-gate submicron gate length GaAs metal-semiconductor field effect transistors", J. Vac. Sci. Technol. B 11(5), September/October 1993; A. Mahajan et al, "Monolithic Integration of InAlAs/InGaAs/InP Enhancement- and Depletion-Mode High Electron Mobility Transistors, IEEE IEDM, pp. 51–53, (1996). The T-shaped electrodes for these devices are produced by exposing T-shaped patterns in the resist at the gate location, developing the resist to form T-shaped openings, and evaporating metal into the T-shaped openings. A lift-off process is used to remove excess metal on the resist surface between T-shaped features. The T-shaped patterns are formed by e-beam lithography. The e-beam approach has been successful but the e-beam writing step to form the T-shaped features is slow due to the characteristically slow raster scan of e-beam lithography, and consequently very expensive. A better approach from the standpoint of throughput would be to use the blanket exposure that is characteristic of photolithographic processes.

Using the technique of the invention T-shaped Schottky gate structures for use in III–V field effect transistor devices can be made with a convenient and cost-effective photolithographic process. Multiple exposure of a thick photoresist layer is used to define T-shaped features, and gate contact metal is deposited in the T-shaped features to form the T-gate structure.

Figure 6:
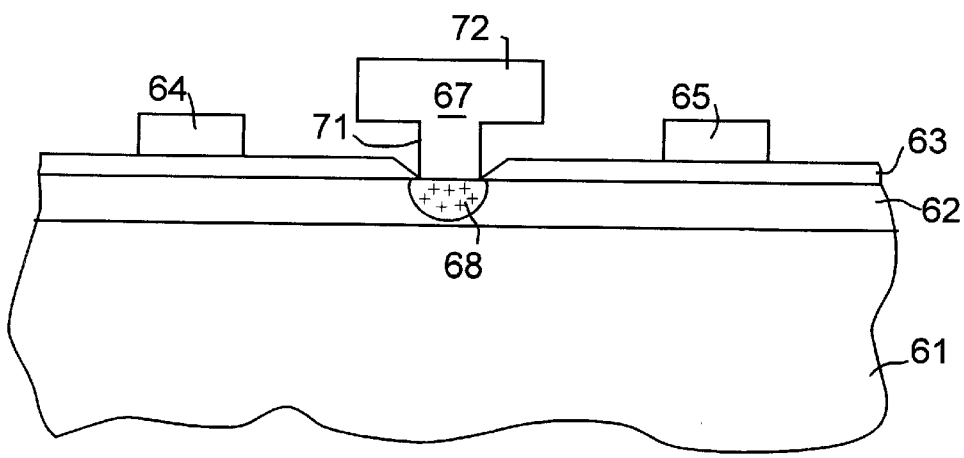
FIG. 6 is a schematic representation of a recessed gate MESFET device with a T-shaped Schottky gate that may be fabricated in accordance with the invention.

Referring to FIG. 6, a MESFET device is shown with substrate 61, typically semi-insulating GaAs, and active layer 62, which is implanted with n-silicon n-type carriers. The cap layer 63 for the source/drain contacts is silicon implanted $n^+$. The source and drain contacts 64 and 65 are conventional metal materials such as Ti/Pd/Au, Ti/Pt/Au, Al/Ti, Au/Ge. The gate is recessed by wet etching a window in layer 63 so that the gate is situated on the active layer 62. MESFET devices are typically depletion mode devices with Schottky gates which, in contrast with Si MOS transistors, are "normally on" devices. The T-shaped Schottky gate for the MESFET device in FIG. 6 is shown at 67, and is made of a conventional contact metal. When reverse biased, n-type carriers are depleted from depletion region 68 beneath the Schottky gate leaving a p-region that pinches off current flow between the source and drain.

The gate 67 is referred to as T-shaped but is not to be confused with gate configurations, known in the art, that are T-shaped in plan view. The gate configuration in FIG. 6, and which describes the objective of this embodiment of the invention, is a vertical T-shape. It can be defined as having a vertical base 71 and a "cross" 72. The shape of the gate in a plan view may be square but is conventionally rectangular in shape with the width w of the gate extending into the plane of the figure and typically terminating in a contact pad (not shown) outside the active region of the device.

Figure 7:
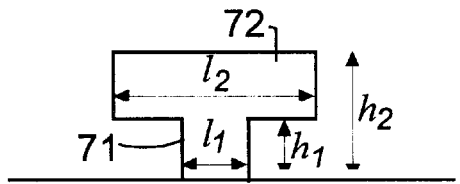
FIG. 7 is a schematic view of a T-shaped gate structure describing the relevant dimensions discussed in this description.

Enhancement of the gate conductivity is a function of the increased cross section between the extremities of the gate along the conduction path. The objective in these devices is to minimize the gate length l which is the device parameter controlling the frequency response of the transistor. When the gate length l is reduced in order to shrink the overall device size, the gate resistance along the gate width w increases proportionately. If the normal gate cross section is $l_1 \times h_1$, the enhanced cross section is $(h_2 \times l_2) - h_1(l_2 - l_1)$. The relevant dimensions are shown in FIG. 7. For example, if $h_2 = 2h_1$ and $l_2 = 3l_1$, i.e. the approximate geometry shown, then the gate conductance enhancement factor is 3.

Figure 8:
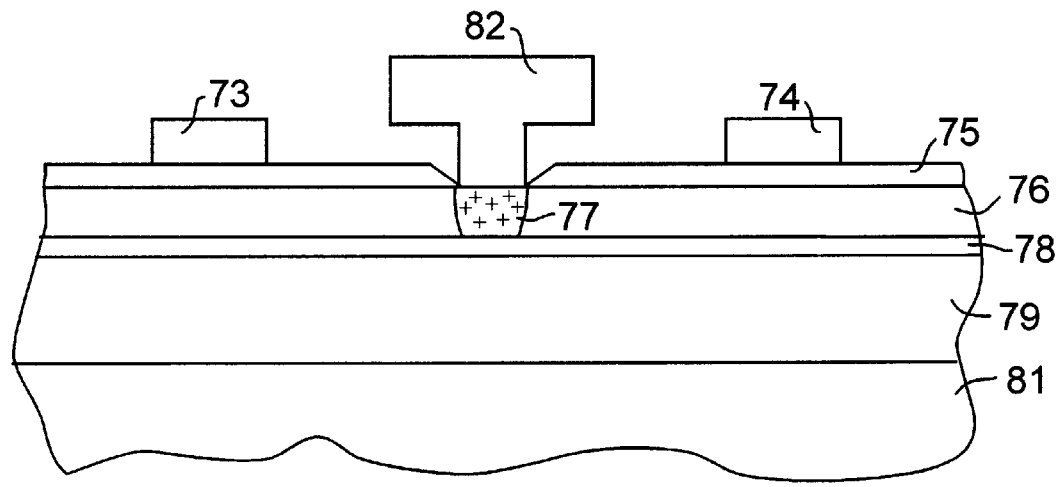
FIG. 8 is a schematic representation of a HEMT device with a T-shaped gate that may be fabricated in accordance with the invention.

Other Schottky gate devices can also take advantage of the enhanced conductivity of T-shaped gates. For example, a HEMT device is shown in FIG. 8. These devices are similar in appearance to the MESFET of FIG. 6 but are more complex in the internal structure and are designed for lower noise, higher frequency performance, and in special structures, higher power. The source and drain contacts 73 and 74 are typically formed on an n+GaAs layer 75 but the Schottky gate in this structure contacts a heterostructure layer 76, e.g. AlGaAs, under contact layer 75. The active layer 76 and the depletion region 77 are otherwise similar to corresponding elements in the MESFET. Layer 78 is a very thin spacer layer of e.g. undoped AlGaAs, and layer 79 is a buffer layer of undoped GaAs. The substrate 81 may be semi-insulating GaAs. The T-shaped Schottky gate structure is shown at 82 and is essentially the same as in the MESFET device of FIG. 6.

The technique for fabricating the T-shaped gate structures according to the invention will be described in conjunction with FIGS. 9–15. For simplicity in describing the processing the functional layers in the substrate will be omitted, the assumption being that these device features are complete at the point in the process where gate fabrication commences. The region of the device being processed in FIGS. 9–15 is the substrate surface between the source and drain electrodes.

Figure 9:
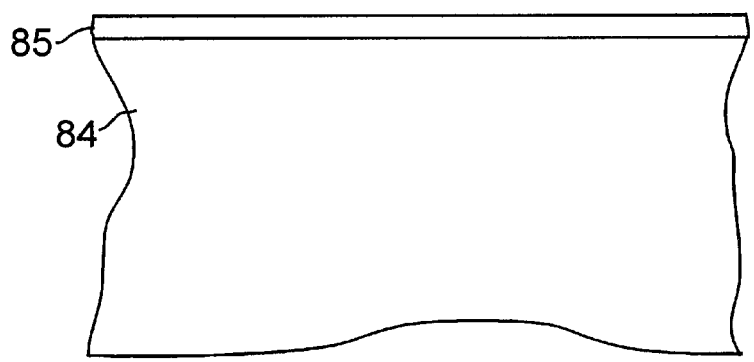
FIGS. 9–15 represent steps in a multiple exposure photolithographic process according to the invention for forming T-gate structures.
Figure 10:
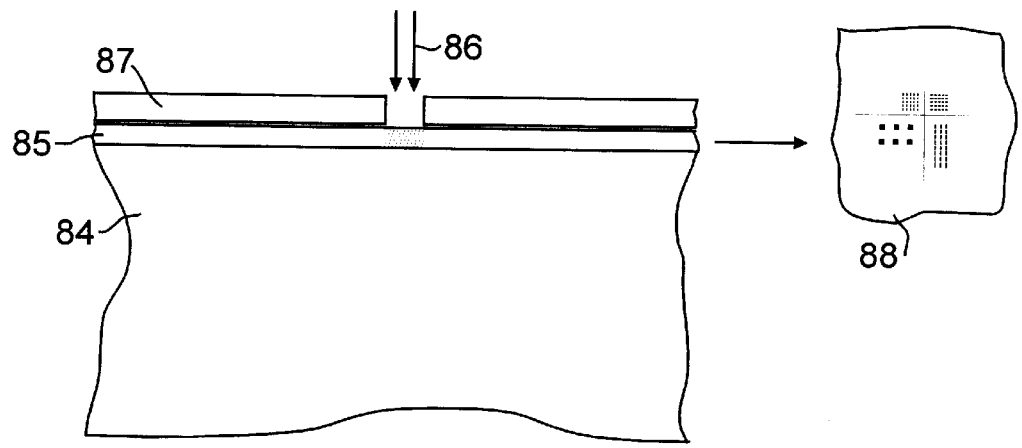

Referring to FIG. 9 the substrate 84 is coated with a first level of photoresist 85. The choice of photoresist for these layers is not critical and can be any conventional resist material, either positive or negative. As an example, Shipley 1805 photoresist may be spun on the wafer at 3000 rpm for 30 seconds to produce a photoresist layer of 0.5 $\mu$m in thickness, and the layer prebaked on a hotplate at 110° C. for 60 seconds. The thickness of the first level of photoresist corresponds to dimension $h_1$ of FIG. 7, and is preferably in the range 0.2–2.0 $\mu$m. The photoresist layer 85 is exposed to actinic radiation 86 through a first photomask 87 using standard practice as shown in FIG. 10. For the Shipley photoresist mentioned above exposure using a Nikon stepper at 436 nm wavelength for 750 milliseconds is effective. The length and width of the photomask feature correspond to the length and width of the base of the T-shaped gate. At the completion of the first exposure a latent image of the alignment marks 88 is formed in layer 85.

Figure 11:
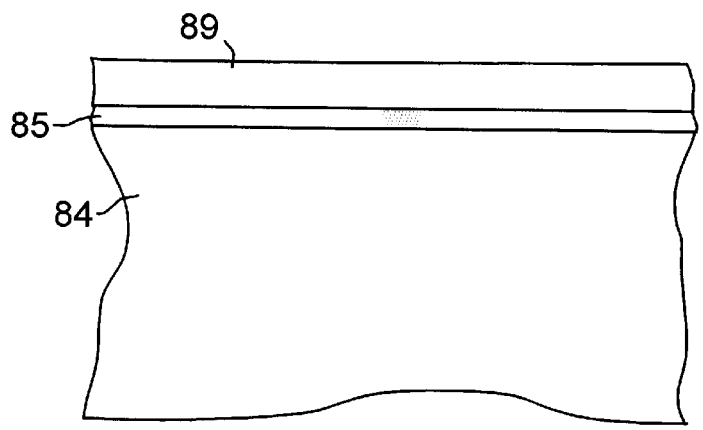

After exposure of layer 85, but prior to developing, the second exposure is made. In this process demonstration, two photoresist layers are used for improved definition of the T-shaped feature. The second photoresist layer 89 is spun on over the photoresist layer 85 as shown in FIG. 11. The thickness of the second level photoresist layer 89 corresponds to dimension $h_2$ of FIG. 7 with excess height added to accommodate the liftoff process as will be described below. The thickness will typically be in the range 0.3–3.0 $\mu$m. Shipley 1818 may be used for the second level photoresist, and e.g. spun at 3000 rpm for 30 seconds giving a photoresist layer thickness of 1.8 $\mu$m. The layer is prebaked on a hotplate at 110° C. for 60 seconds.

Figure 12:
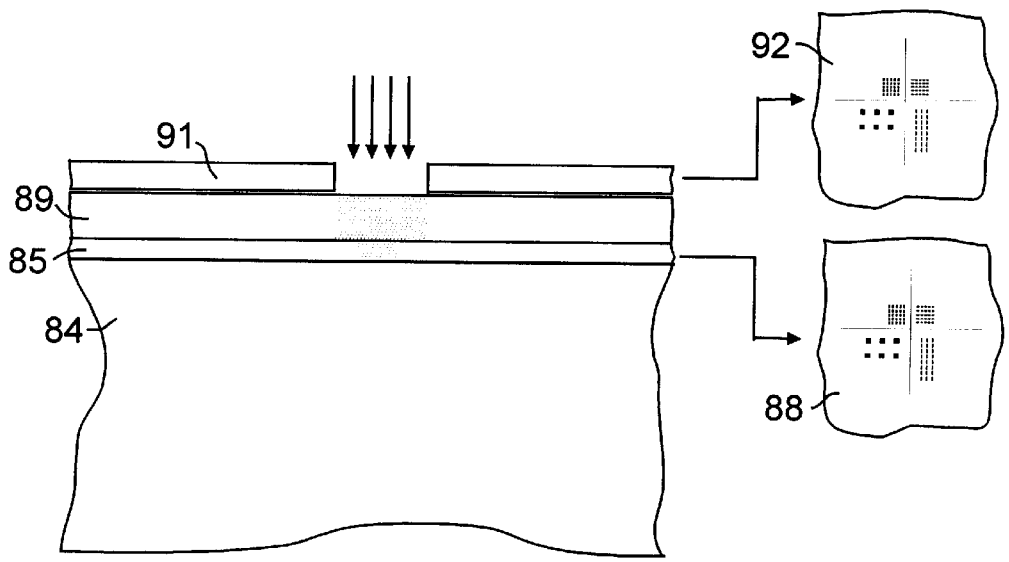

With reference to FIG. 12, the second photoresist layer 89 is exposed using photomask 91 and aligning the alignment marks 92 of photomask 91 with the latent alignment marks 88 in photoresist layer 85. These marks are visible to the automated alignment system of the stepper through the transparent resist layer 91. The opening in photomask 91 corresponds to the cross portion 72 of the "T" as shown in FIGS. 6–8. The exposure time for the Nikon stepper to expose to the bottom of the second photoresist level was 1200 milliseconds.

Figure 13:
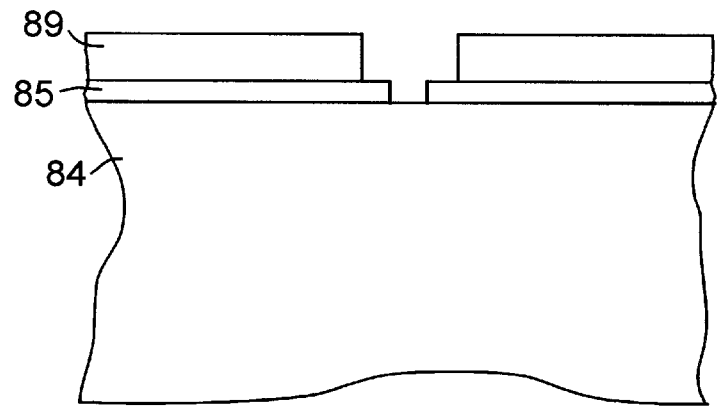
Figure 14:
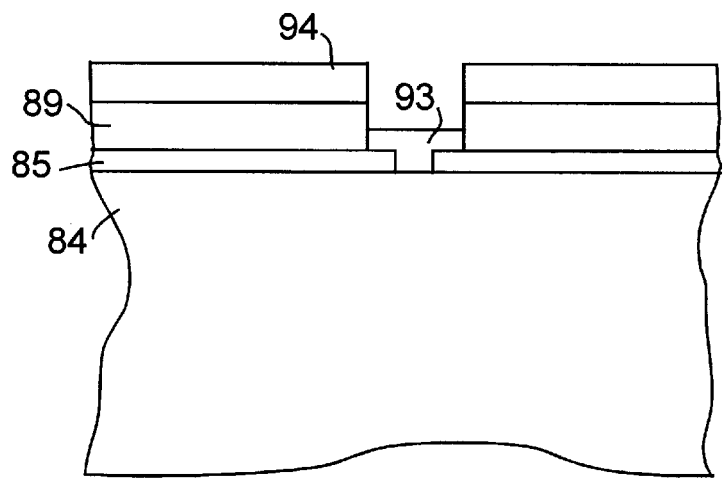

After the multiple exposures are completed, the two levels of photoresist are developed in Shipley 321 developer and rinsed in D.I. water for 30 seconds. The resulting structure, shown in FIG. 13, is then ready for metallization to form the T-shaped gate.

The T-shaped exposure pattern can also be formed using a single layer of photoresist as in the earlier example. Multiple exposures are used while varying the depth of focus, and mixing between the two resist layers is avoided.

The deposition technique used to deposit the metal, and the composition of the metal are subject to a variety of choices known to those in the art. Evaporation is preferred because it is relatively directional, and therefore is well suited for lift-off processes. Sputtering may also be used. Conformal coating processes such as Chemical Vapor Deposition (CVD), Molecular Beam Epitaxy (MBE) and Atomic Layer Deposition (ALD), are less likely to be effective but ways may be devised by those skilled in the art to adapt these techniques to the process described. In the specific example described here, the preferred deposition technique is evaporation using an e-beam evaporation process. Prior to evaporation the substrate may be exposed to a pre-deposit cleaning operation for 3 minutes in an oxygen plasma at 50 watts and 250 mTorr, followed by a 10:1 $HCl:H_2O$ rinse for 30 seconds. The surface is blow dried with nitrogen for 30 seconds. A suitable metallization for most applications, which is well established in this technology, is 250 Angstroms titanium, 500 Angstroms platinum, and 8000 Angstroms gold. After evaporation of the metal the structure appears as in FIG. 14 with the metallization shown at 93 in the gate region and at 94 on the surface of the second level of resist. A vertical separation between these metal bodies is intentionally created to facilitate the lift-off process as is well known. An acceptable difference between the thickness of the metal layer ($h_1+h_2$) and the combined thickness of the photoresist layers, $t_1+t_2$, is at least 30%, i.e. $t_1+t_2=1.3(h_1+h_2)$, and preferably at least 100%, i.e. $t_1+t_2=2(h_1+h_2)$.

Figure 15:
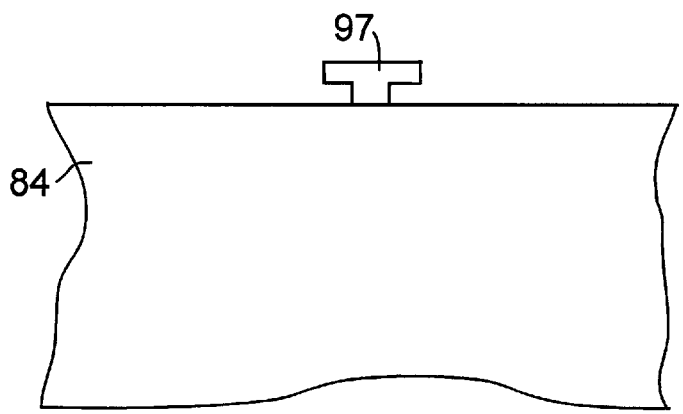

The two levels of resist 85 and 89, carrying the surface layer of unwanted metal 94 are then dissolved in a solvent such as acetone, leaving the final T-shaped gate 97 as shown in FIG. 15.

In the foregoing description the image of the alignment marks formed in the first photoresist layer is referred to as a "latent" image. This refers to an image that is discernible by some means even though it may be only marginally visible to the human eye.

The operation of the photolithography apparatus normally involves an alignment step and an exposure step. The reticle is registered to the alignment pattern on the substrate using the laser alignment system, and the appropriate UV exposure is made. The reticle is stepped to the next site, and the operation is repeated. In the first exposure of the wafer fabrication sequence there is no alignment pattern on the substrate. Normally, the invention described above will be most useful when the multiple exposure is used as the first photolithographic operation in the wafer fabrication sequence, i.e. when there are no alignment patterns present on the substrate. Thereafter, alignment patterns will typically be available for multiple alignments to those patterns.

As should be evident from the description above, the embodiment of the invention in which multiple exposures are made in a single photoresist layer relies on the ability to expose the layer at different thickness levels. This can easily be implemented using the spatial focusing matrix described earlier. Other techniques may be found for reaching the same result. Bi-level resist and tri-level resist schemes can be used. Resist levels having different actinic properties can be used, as well as different exposure wavelengths.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for the manufacture of a Schottky gate transistor comprising the steps of:

forming a source and drain in a III–V semiconductor substrate, and forming a Schottky gate on the surface of said III–V semiconductor between said source and drain the invention characterized in that said Schottky gate is formed by the steps comprising:

a. depositing a first level of photoresist on the surface of said substrate, said first level of photoresist having a thickness $t_1$, b. exposing said first level of photoresist with a first photomask with a first photolithographic pattern having a rectangular shape with width $w_1$ and length $l_1$, with the length dimension extending along the direction separating the source and drain, said first photolithographic pattern further having at a first set of alignment marks, thereby forming a latent image of said first set of alignment marks in said first level of photoresist, c. depositing a second level of photoresist on said first level of photoresist, said second level of photoresist having a thickness $t_2$, d. aligning a second photomask to said substrate by registering a second set of alignment marks on said second photomask with said latent image of said first set of alignment marks, e. exposing said second level of photoresist with a pattern having a rectangular shape with width $w_2$ and length $l_2$, and further where length $l_2$ is greater than length $l_1$, f. developing said first and second levels of photoresist to form a T-shaped feature, g. depositing a metal layer to fill a portion of said T-shaped feature, said metal layer having a thickness $h_1+h_2$, where $h_1$ is essentially equal to $t_1$ and $h_2$ is substantially less than $t_2$, and h. dissolving away said first and second level of photoresist leaving a T-shaped Schottky gate.

2. The method of claim 1 wherein said Schottky gate transistor is a MESFET.

3. The method of claim 1 wherein said Schottky gate transistor is a HEMT.

4. The method of claim 1 in which $l_2$ is at least twice $l_1$.

5. The method of claim 1 wherein the dimensions $l_1$, $l_2$, $h_1$ and $h_2$ are related by:

$$(l_2-l_1) \times (h_2-h_1) > 0.5(l_1 \times h_2).$$

6. The method of claim 5 wherein $w_1$ is approximately equal to $w_2$.

7. A method for the manufacture of a Schottky gate transistor comprising the steps of:

forming a source and drain in a III–V semiconductor substrate, and forming a Schottky gate on the surface of said III–V semiconductor between said source and drain the invention characterized in that said Schottky gate is formed by the steps comprising:

a. depositing a layer of photoresist on the surface of said substrate, said layer of photoresist having a thickness $t_1+t_2$, b. exposing a first thickness $t_1$ of said layer of photoresist using a first photomask with a first photolithographic pattern having a rectangular shape with width $w_1$ and length $l_1$, with the length dimension extending along the direction separating the source and drain, said first photolithographic pattern further having at a first set of alignment marks, thereby forming a latent image of said first set of alignment marks in said first level of photoresist, c. aligning a second photomask to said substrate by registering a second set of alignment marks on said second photomask with said latent image of said first set of alignment marks, d. exposing a second thickness $t_2$ of said layer of photoresist using a pattern having a rectangular shape with width $w_2$ and length $l_2$, and further where length $l_2$ is greater than length $l_1$, e. developing said layer of photoresist to produce a T-shaped feature, f. depositing a metal layer to fill a portion of said T-shaped feature, said metal layer having a thickness $h_1+h_2$, where $h_1$ is essentially equal to $t_1$ and $h_2$ is substantially less than $t_2$, and g. dissolving away said layer of photoresist leaving a T-shaped Schottky gate.

8. The method of claim 7 wherein said Schottky gate transistor is a MESFET.

9. The method of claim 7 wherein said Schottky gate transistor is a HEMT.

10. The method of claim 7 in which $l_2$ is at least twice $l_1$.

11. The method of claim 7 wherein the dimensions $l_1$, $l_2$, $h_1$ and $h_2$ are related by:

$$(l_2-l_1) \times (h_2-h_1) > 0.5(l_1 \times h_2).$$

12. The method of claim 11 wherein $w_1$ is approximately equal to $w_2$.

* * * * *